United States Patent [19]
Wakabayashi et al.

[11] Patent Number: 6,121,120
[45] Date of Patent: Sep. 19, 2000

[54] METHOD FOR MANUFACTURING SEMICONDUCTOR DEVICE CAPABLE OF FLATTENING SURFACE OF SELECTIVELY-GROWN SILICON LAYER

[75] Inventors: Hitoshi Wakabayashi; Toru Tatsumi, both of Tokyo, Japan

[73] Assignee: NEC Corporation, Tokyo, Japan

[21] Appl. No.: 09/130,655

[22] Filed: Aug. 7, 1998

[30] Foreign Application Priority Data

Aug. 7, 1997 [JP] Japan ..................................... 9-213141
Nov. 7, 1997 [JP] Japan ..................................... 9-305506

[51] Int. Cl.[7] .................................................. H01L 21/20
[52] U.S. Cl. .......................... 438/478; 438/473; 438/514; 257/915
[58] Field of Search ..................................... 438/478, 473, 438/514; 257/915

[56] References Cited

U.S. PATENT DOCUMENTS

| | | | |
|---|---|---|---|
| 4,975,385 | 12/1990 | Beinglass et al. | 437/44 |
| 5,298,459 | 3/1994 | Arikawa et al. | 437/183 |
| 5,302,240 | 4/1994 | Hori et al. | 156/643 |
| 5,401,359 | 3/1995 | Kadomura | 156/662 |
| 5,612,240 | 3/1997 | Chang | 437/44 |
| 5,618,749 | 4/1997 | Takahashi et al. | 438/384 |
| 5,648,287 | 7/1997 | Tsai et al. | 437/44 |
| 5,915,197 | 6/1999 | Yamanaka et al. | 438/586 |
| 6,005,291 | 8/1998 | Koyanagi et al. | 257/751 |

FOREIGN PATENT DOCUMENTS

| | | |
|---|---|---|
| 59-168675 | 9/1984 | Japan . |
| 63-115376 | 5/1988 | Japan . |
| 3-30422 | 2/1991 | Japan . |
| 3-163822 | 7/1991 | Japan . |
| 3-203229 | 9/1991 | Japan . |
| 4-179219 | 6/1992 | Japan . |
| 4-216618 | 8/1992 | Japan . |
| 5-102183 | 4/1993 | Japan . |
| 7-161974 | 6/1995 | Japan . |
| 8-222738 | 8/1996 | Japan . |
| 9-205065 | 8/1997 | Japan . |
| 9-219516 | 8/1997 | Japan . |
| 9-283462 | 10/1997 | Japan . |

OTHER PUBLICATIONS

Takao Abe, Masahiko Kogirima, Kenji taniguchi; "Electronic Materials Series: Silicon crystals and doping," vol. 2, Maruzen Co., Ltd., Mar. 25, 1988, p. 88–9.

S.Wolf and R.N. Tauber, Silicon Processing for the VLSI Era, vol. 1 Lattice Press, Calif. pp. 532–535, 1986.

Webster's Dictionary, Tenth Ed. Merriam–Webster,Inc. Mass. p. 1092, 1999.

*Primary Examiner*—Matthew Smith
*Assistant Examiner*—Granvill Lee
*Attorney, Agent, or Firm*—Sughrue, Mion, Zinn, Macpeak & Seas, PLLC

[57] ABSTRACT

In a method for manufacturing a semiconductor device, an impurity diffusion region is formed within a semiconductor substrate. Then, a chemical dry etching process or a heating process is carried out to remove a contamination layer from the impurity diffusion region. Then, a silicon layer is selectively grown on the impurity diffusion region.

51 Claims, 26 Drawing Sheets

METHOD FOR MANUFACTURING SEMICONDUCTOR DEVICE CAPABLE OF FLATTENING SURFACE OF SELECTIVELY-GROWN SILICON LAYER

BACKGROUND OF THE INVENTION

1. Field of the Invention

The present invention relates to a method for manufacturing a semiconductor device, and more particularly, to a method for selectively growing a silicon layer by an epitaxial process.

2. Description of the Related Art

Generally, in a highly-integrated semiconductor device such as a metal oxide semiconductor (MOS) device, since the cross-section of each element has been decreased in size, the sheet resistance of a gate electrode and the shallow junction of source/drain regions have been increased. In order to decrease this sheet resistance, a self-aligned silicide (salicide) technology can be used. For example, a silicon layer is selectively grown on a source/drain region of a semiconductor substrate, a refractory metal layer is formed on the selectively-grown silicon layer, and a heating operation is carried out to obtain a salicide layer.

In the above-described prior art method, however, since the interface between the refractory metal layer and the source/drain region is uneven, the shallow junction of high concentration formed by the silicon substrate and the source/drain region is deteriorated. This will be explained later in detail.

SUMMARY OF THE INVENTION

It is an object of the present invention to flatten the surface of a selectively-grown silicon layer on an impurity diffusion region of a semiconductor substrate.

According to the present invention, in a method for manufacturing a semiconductor device, an impurity diffusion region is formed within a semiconductor substrate. Then, a chemical dry etching process or a heating process is carried out to remove a contamination layer from the impurity diffusion region. Then, a silicon layer is selectively grown on the impurity diffusion region.

That is, contamination material including oxygen doped by an ion implantation process or fluorine is usually segregated on the surface of the impurity diffusion region, which makes the selectively-grown silicon layer uneven. Such contamination material can be removed by the above-mentioned chemical dry etching process or heating process.

In another aspect of the present invention, a silicon layer is selectively grown by controlling the flow rate of silane gas and the growth temperature of the silicon layer in a reaction rate determining region. As a result, the surface of the silicon layer becomes even regardless of the underlying impurity diffusion region including a contamination layer or defects.

The inventors have found that, when the flow rate of silane gas is larger to increase supply of hydrogen and the growth temperature is lower to suppress the elimination of hydrogen from the substrate, generation of uneven grooves on the impurity diffusion region can be suppressed. This is because hydrogen in proximity of the surface of the impurity diffusion region suppresses the diffusion of atoms thereon. Therefore, even when impurity material such as silicon oxide exists on the surface of the impurity diffusion region, this impurity material is buried in the selectively-grown silicon layer.

The above-mentioned condition of the flow rate of silane gas and the growth of temperature is in a "reaction rate determining region" where the growth speed of silicon is dependent upon the growth temperature rather than the flow rate of silane gas.

In the reaction rate determining region, when the selectively grown silicon layer becomes thick, the growth of silicon, which is in this case monocrystalline silicon, fluctuates. That is, when silane ($Si_2H_6$) gas is irradiated onto silicon oxide ($SiO_2$), $Si_2H_6$ molecules may be tripped in a meta-stable state of the silicon oxide, and after that, $Si_2H_6$ molecules are again eliminated therefrom. In this case, some of the $Si_2H_6$ molecules dependent upon the growth temperature are decomposed into silicon atoms and hydrogen, so that the silicon atoms are adhered to the surface of silicon oxide. Additionally, when the silicon atoms adhered to the surface of silicon oxide exceed a critical amount, the silicon atoms turn to silicon nuclei, so that islands made of polycrystalline silicon are formed on the surface of silicon oxide. Once such islands are formed, the islands may rapidly grow, since the growth speed of the islands is also dependent upon the growth temperature. Thus, the growth of selectively grown silicon fluctuates due to the polycrystalline silicon islands formed on silicon oxide.

In order to suppress the formation of the above-mentioned polycrystalline silicon islands, an etching process for the polycrystalline silicon islands using halogen gas is carried out during the selectively growing step. Note that the selectively grown silicon layer is hardly etched by such an etching process. That is, when silane ($Si_2H_6$) gas is irradiated onto the surface of silicon oxide, the density of silicon atoms on the surface of silicon oxide is increased. In this state, before the formation of polycrystalline silicon islands, when halogen gas such as chlorine ($Cl_2$) gas or fluorine ($F_2$) gas is irradiated onto the surface of silicon oxide, the silicon atoms on the surface of silicon oxide react with $Cl_2$ gas or $F_2$ gas so that $SiCl_2$ or $SiF_2$ having a high vapor pressure is formed and evaporated, since the silicon atoms on the surface of silicon oxide have weak back bond coupling. On the other hand, even when the selectively grown monocrystalline silicon is irradiated with hydrogen gas the monocrystalline silicon is hardly etched, since the silicon atoms of the monocrystalline silicon have strong back bond (covalent bond) coupling.

Note that the silicon atoms of the polycrystalline silicon islands are hardly removed by the irradation of halogen gas.

In the reaction rate determining region, when the selectively grown silicon layer becomes sufficiently thick so that a sidewall layer made of silicon oxide is buried therein, a bridge where a gate polycrystalline silicon electrode is connected to the impurity (source/drain) diffusion region may occur, which reduces the reliability of the device. Therefore, after the silicon oxide on the source/drain impurity diffusion region is completely buried in the silicon layer and the surface thereof becomes flat, the control is switched from the reaction rate determining region to a "supply rate determining region" where the growth speed of silicon is dependent upon the flow rate of silane gas rather than the growth temperature. For example, the growth temperature is increased to enhance the elimination of hydrogen from the semiconductor substrate, and the flow rate of silane gas is decreased to decrease the supply of hydrogen. In the supply rate determining region, a clean and flat silicon layer is further selectively grown, so that pits (uneven grooves) hardly occur. In addition, since the amount of hydrogen on the surface of the selectively grown silicon layer is decreased, this surface is departed from a sidewall made of silicon oxide, thus suppressing the above-mentioned bridge.

The thickness of a first silicon layer selectively grown in the reaction rate determining region is about 0.1 to 500 nm to completely cover the silicon oxide. The thickness of a second silicon layer selectively grown in the supply rate determining region is dependent upon the thickness of the first silicon layer and the thickness of a required silicide layer, and is about 1 to 500 nm, for example.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art method for manufacturing a semiconductor device will be explained with reference to FIGS. 1A through 1F.

Figure 1A:
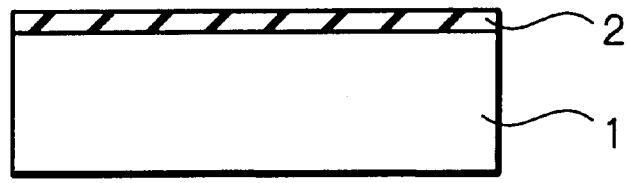
FIGS. 1A through 1F are cross-sectional views for explaining a prior art method for manufacturing a semiconductor device.

First, referring to FIG. 1A, an about 10 nm thick cover layer 2 made of silicon oxide or the like is deposited by a thermal oxidation process or a chemical vapor deposition (CVD) process on a silicon substrate 1 which is of an N-type, for example. Then, about $1\times10^{16}$ impurity ions such as fluoroboron ions per $cm^2$ are implanted at an energy of about 60 keV into the silicon substrate 1. Then, an annealing operation is carried out at a temperature of higher than 600° C. for less than 1 hour to activate the implanted impurity ions in the silicon substrate 1.

Figure 1B:
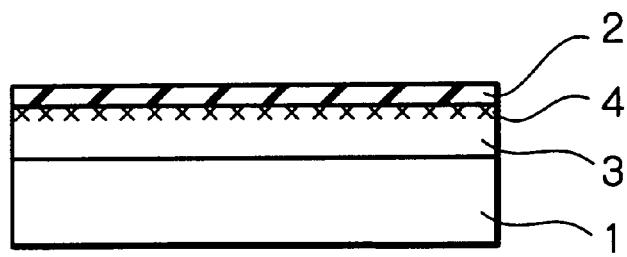

As a result, as illustrated in FIG. 1B, a source/drain region 3 is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron ($BF_2$) ions.

Figure 1C:
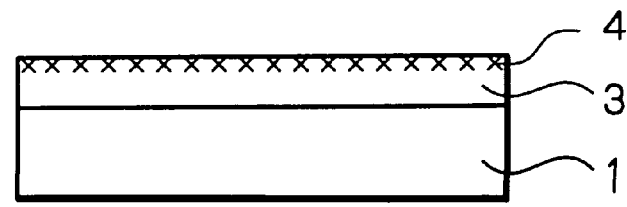

Next, referring to FIG. 1C, the cover layer 2 is removed by a dry etching process using chlorine gas or a wet etching process using fluoric acid.

Figure 1D:
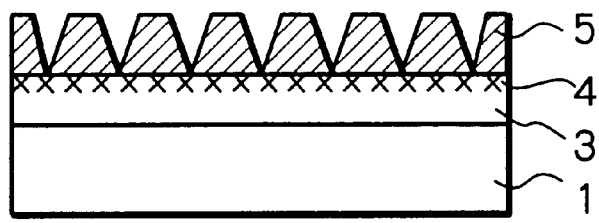

Next, referring to FIG. 1D, a silicon layer 5 is selectively grown on the source/drain region 3. Note that the surface of the silicon layer 5 is uneven due to the contamination layer 4.

Figure 1E:
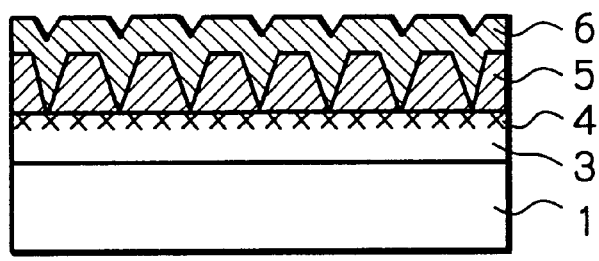

Next, referring to FIG. 1E, a refractory metal layer 6 made of titanium is deposited on the entire surface. Then, a heating operation is carried out, so that, the refractory metal layer 6 reacts with the silicon layer 5. As a result, an uneven refractory metal silicide layer 7 is formed as illustrated in FIG. 1F.

Figure 1F:
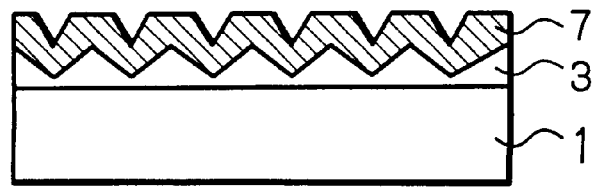

In FIG. 1F, an unreacted portion of the refractory metal layer 6 is removed.

In the prior art method as illustrated in FIGS. 1A through 1F, however, since the interface between the refractory metal layer 7 and the source/drain region 3 is uneven, the shallow junction of high concentration formed by the silicon substrate 1 and the source/drain region 3 is deteriorated.

FIGS. 2A through 2F illustrate a first embodiment of the present invention.

Figure 2A:
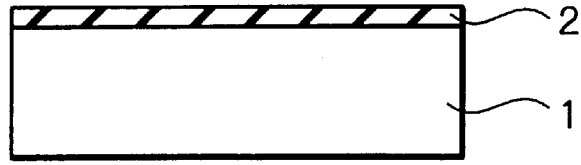
FIGS. 2A through 2F are cross-sectional views for explaining a first embodiment of the method for manufacturing a semiconductor device according to the present invention.

First, referring to FIG. 2A, in the same way as in FIG. 1A, an about 5 to 30 nm thick cover layer 2 made of silicon oxide or the like is deposited by a thermal oxidation process or a CVD process on a silicon substrate 1 which is of an N-type, for example. Then, about 1 to $5\times10^{15}$ impurity ions such as fluoroboron ions per $cm^2$ are implanted at an energy of about 10 to 60 kev into the silicon substrate 1. Then, an annealing operation is carried out at a temperature of about 1000° C. for about 10 s to activate the implanted impurity ions in the silicon substrate 1.

Figure 2B:
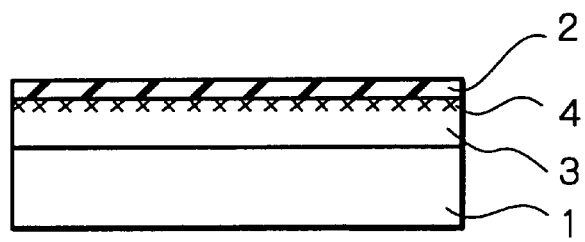

As a result, as illustrated in FIG. 2B, in the same way as in FIG. 1B, a source/drain region 3 is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron ($BF_2$) ions.

Figure 2C:
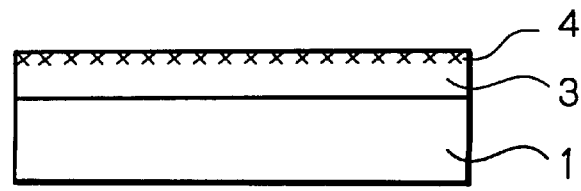

Next, referring to FIG. 2C, in the same way as in FIG. 1C, the cover layer 2 is removed by a dry etching process using chlorine gas or a wet etching process using fluoric acid.

Figure 2D:
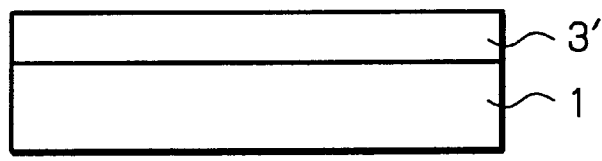

Next, referring to FIG. 2D, the contamination layer 4 is etched by a chemical dry etching process using $CF_4$ gas and/or $Cl_2$ gas, since the contamination layer 4 includes fluorine of high concentration. Thus, a source/drain region 3' having no contamination or defects is obtained.

Figure 2E:
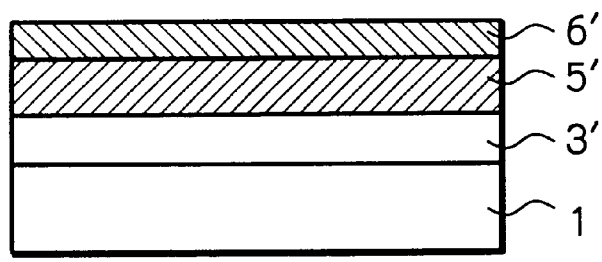

Next, referring to FIG. 2E, an about 40 nm thick silicon layer 5' having no defects is selectively grown on the source/drain region 3'. Note that the surface of the silicon layer 5' is even. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 2F.

Figure 2F:
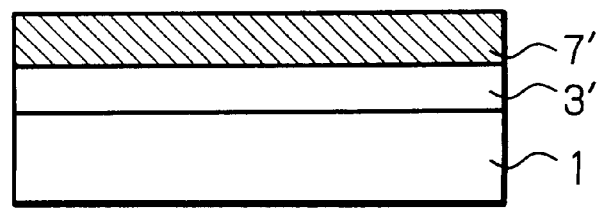

In FIG. 2F, an unreacted portion of the refractory metal layer 6' is removed.

Thus, in the first embodiment as illustrated in FIGS. 2A through 2F, since the interface between the refractory metal layer 7' and the source/drain region 3' is flat, the shallow junction of high concentration formed by the silicon substrate 1 and the source/drain region 3' is not deteriorated.

FIGS. 3A through 3F illustrate a second embodiment of the present invention.

Figure 3A:
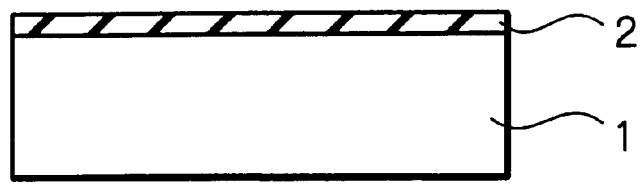
FIGS. 3A through 3F are cross-sectional views for explaining a second embodiment of the method for manufacturing a semiconductor device according to the present invention.

First, referring to FIG. 3A, in the same way as in FIG. 2A, an about 5 to 30 nm thick cover layer 2 made of silicon oxide or the like is deposited by a thermal oxidation process or a CVD process on a silicon substrate 1 which is of an N-type, for example. Then, about 1 to $3\times10^{15}$ impurity ions such as fluoroboron ions per $cm^2$ are implanted at an energy of about 10 to 60 keV into the silicon substrate 1. Then, an annealing operation is carried out at a temperature of about 1000° C. for about 10 s to activate the implanted impurity ions in the silicon substrate 1.

Figure 3B:
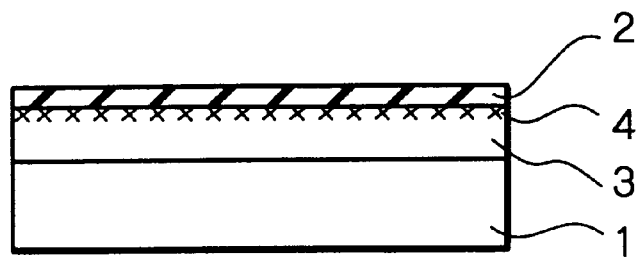

As a result, as illustrated in FIG. 3B, in the same way as in FIG. 2B, a source/drain region 3 is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron ($BF_2$) ions.

Figure 3C:
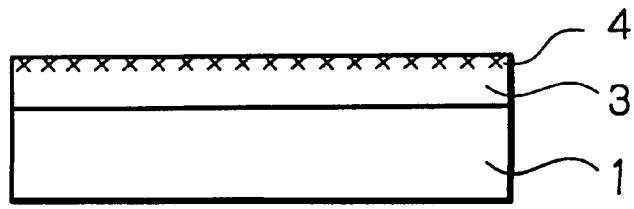

Next, referring to FIG. 3C, in the same way as in FIG. 2C, the cover layer 2 is removed by a dry etching process using chlorine gas or a wet etching process using fluoric acid.

Figure 3D:
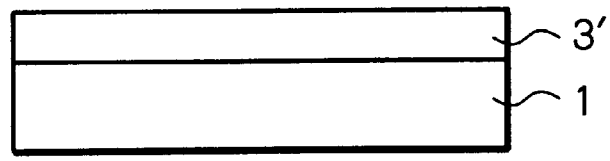

Next, referring to FIG. 3D, the contamination layer 4 is evaporated by a heating process at a temperature of about 1000° C. for a about 10 s in a vacuum atmosphere or an inactive gas atmosphere such as an argon gas atmosphere, since the contamination layer 4 includes fluorine of high concentration. Thus, a source/drain region 3' having no contamination or defects is obtained.

Figure 3E:
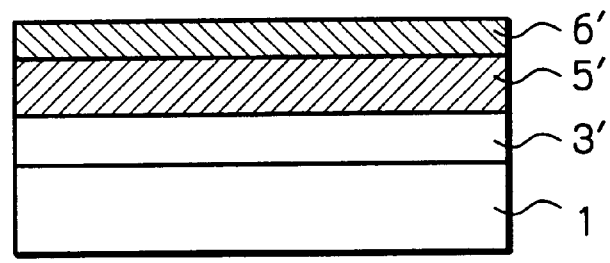

Next, referring to FIG. 3E, in the same way as in FIG. 2E, an about 40 nm thick silicon layer 5' having no defects is selectively grown on the source/drain region 3'. Note that the surface of the silicon layer 5' is even. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 3F.

Figure 3F:
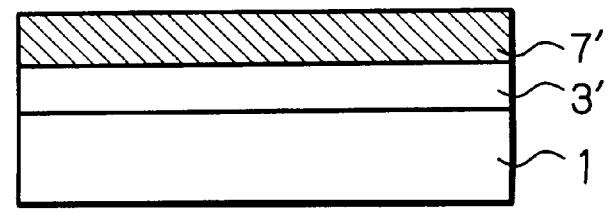

In FIG. 3F, an unreacted portion of the refractory metal layer 6' is removed.

Thus, in the second embodiment as illustrated in FIGS. 3A through 3F, since the interface between the refractory metal layer 7' and the source/drain region 3' is flat, the shallow junction of high concentration formed by the silicon substrate 1 and the source/drain region 3' is not deteriorated.

FIGS. 4A through 4F illustrate a third embodiment of the present invention.

Figure 4A:
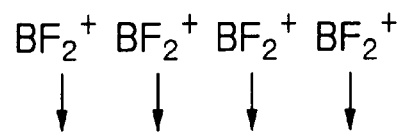
FIGS. 4A through 4F are cross-sectional views for explaining a third embodiment of the method for manufacturing a semiconductor device according to the present invention.

First, referring to FIG. 4A, about 1 to $5\times10^{15}$ impurity ions such as fluoroboron ions per $cm^2$ are implanted at an energy of about 10 to 60 kev into a silicon substrate 1 which is of an N-type, for example.

Figure 4B:

Next, referring to FIG. 4B, an about 5 to 30 nm thick cover layer 2 made of silicon oxide or the like is deposited by a thermal oxidation process or a CVD process on a silicon substrate 1. Then, an annealing operation is carried out at a temperature of about 1000° C. for about 10 s to activate the implanted impurity ions in the silicon substrate 1.

As a result, as illustrated in FIG. 4B, in the same way as in FIG. 2B, a source/drain region 3 is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron ($BF_2$) ions.

Figure 4C:
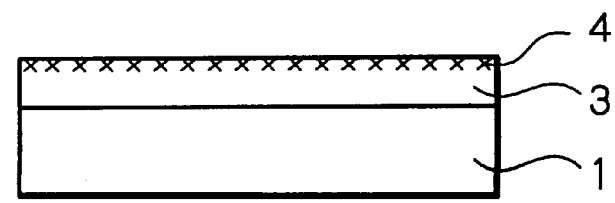

Next, referring to FIG. 4C, in the same way as in FIG. 2C, the cover layer 2 is removed by a dry etching process using chlorine gas or a wet etching process using fluoric acid.

Figure 4D:
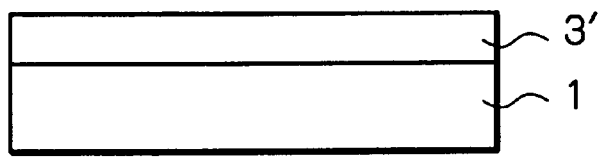

Next, referring to FIG. 4D, in the same way as in FIG. 2D, the contamination layer 4 is etched by a chemical dry etching process using $CF_4$ gas and/or $Cl_2$ gas, since the contamination layer 4 includes fluorine of high concentration. Thus, a source/drain region 3' having no contamination or defects is obtained.

Figure 4E:
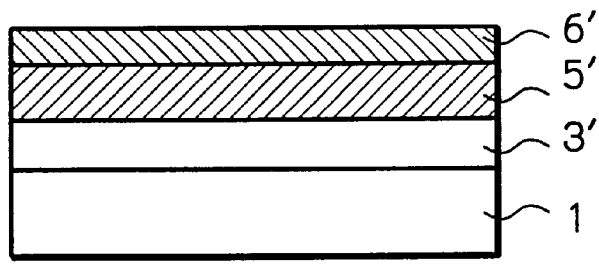

Next, referring to FIG. 4E, in the same way as in FIG. 2E, an about 40 nm thick silicon layer 5' having no defects is selectively grown on the source/drain region 3'. Note that the surface of the silicon layer 5' is even. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 4E.

Figure 4F:
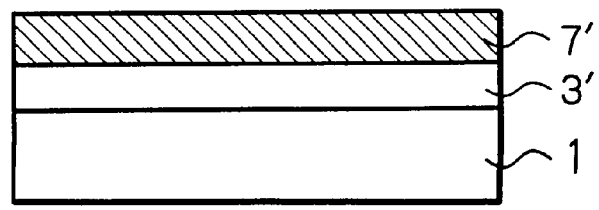

In FIG. 4F, an unreacted portion of the refractory metal layer 6' is removed.

Thus, in the third embodiment as illustrated in FIGS. 4A through 4F, since the interface between the refractory metal layer 7' and the source/drain region 3' is flat, the shallow junction of high concentration formed by the silicon substrate 1 and the source/drain region 3' is not deteriorated.

FIGS. 5A through 5F illustrate a fourth embodiment of the present invention.

Figure 5A:
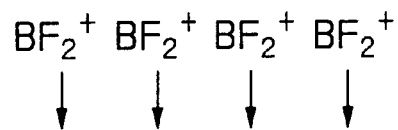
FIGS. 5A through 5F are cross-sectional views for explaining a fourth embodiment of the method for manufacturing a semiconductor device according to the present invention.

First, referring to FIG. 5A, about 1 to $5\times10^{15}$ impurity ions such as fluoroboron ions per $cm^2$ are implanted at an energy of about 30 keV into a silicon substrate 1 which is of an N-type, for example.

Figure 5B:

Next, referring to FIG. 5B, an about 5 to 30 nm thick cover layer 2 made of silicon oxide or the like is deposited by a thermal oxidation process or a CVD process on a silicon substrate 1. Then, an annealing operation is carried out at a temperature of about 1000° C. for about 10 s to activate the implanted impurity ions in the silicon substrate 1.

As a result, as illustrated in FIG. 5B, in the same way as in FIG. 3B, a source/drain region 3 is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron ($BF_2$) ions.

Figure 5C:
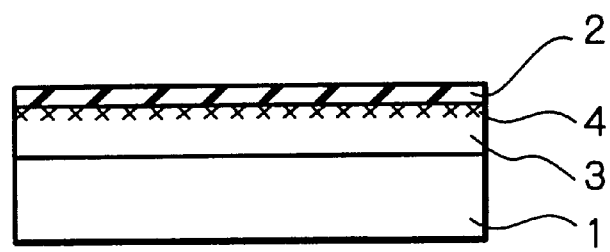

Next, referring to FIG. 5C, in the same way as in FIG. 3c, the cover layer 2 is removed by a dry etching process using chlorine gas or a wet etching process using fluoric acid.

Figure 5D:
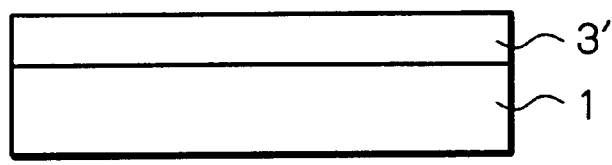

Next, referring to FIG. 5D, in the same way as in FIG. 3D, the contamination layer 4 is evaporated by a heating process at a temperature of about 1000° C. for about 10 s in a vacuum atmosphere or an inactive gas atmosphere such as an argon gas atmosphere, since the contamination layer 4 includes fluorine of high concentration. Thus, a source/drain region 3' having no contamination or defects is obtained.

Figure 5E:
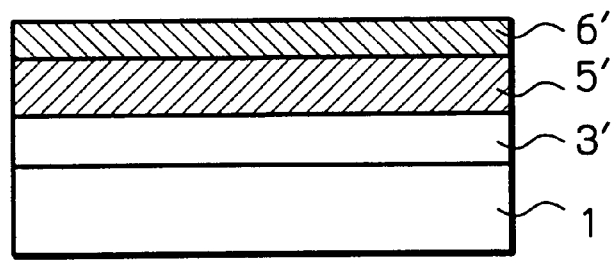

Next, referring to FIG. 5E, in the same way as in FIG. 3E, an about 40 nm thick silicon layer 5' having no defects is selectively grown on the source/drain region 3'. Note that the surface of the silicon layer 5' is even. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 5F.

Figure 5F:
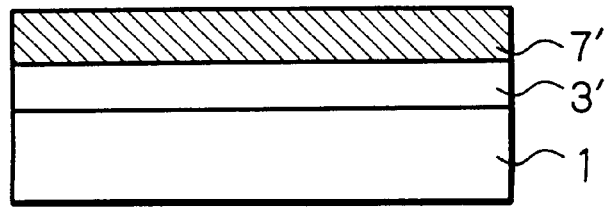

In FIG. 5F, an unreacted portion of the refractory metal layer 6' is removed.

Thus, in the fourth embodiment as illustrated in FIGS. 5A through 5F, since the interface between the refractory metal layer 7' and the source/drain region 3' is flat, the shallow junction of high concentration formed by the silicon substrate 1 and the source/drain region 3' is not deteriorated.

FIGS. 6A through 6F illustrate a fifth embodiment of the present invention.

Figure 6A:
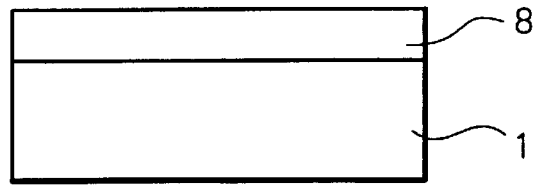
FIGS. 6A through 6F are cross-sectional views for explaining a fifth embodiment of the method for manufacturing a semiconductor device according to the present invention.

First, referring to FIG. 6A, an about 10 to 300 nm thick impurity diffusion source made of silicon oxide 8 having a boron concentration of higher than $7 \times 10^{19}$ atoms/cM$^2$ is deposited on a silicon substrate 1 which is of an N-type, for example.

Figure 6B:
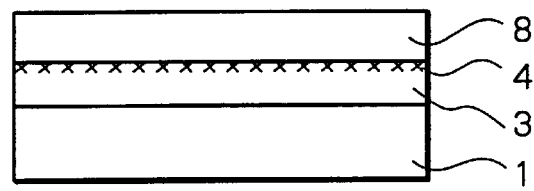

Next, referring to FIG. 6B, a heating operation is carried out at a temperature of higher than 600° C., for example, about 1000 for about 10 s to diffuse the impurity ions from the impurity diffusion source 8 into the silicon substrate 1. As a result, a source/drain region 3 is formed within the silicon substrate 1. This is called a solid phase diffusion process. Simultaneously, a contamination layer 4 is formed on the silicon substrate 1. The contamination layer 4 is made of contamination material such as oxygen and fluorine Next, referring to FIG. 6C, the impurity diffusion source 8 is removed by a dry etching process using chlorine gas or a wet etching process using fluaric acid.

Figure 6C:
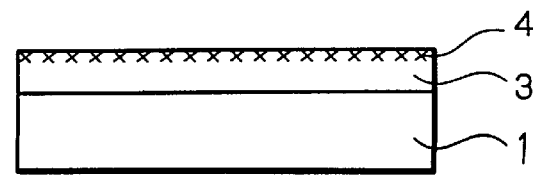
Figure 6D:
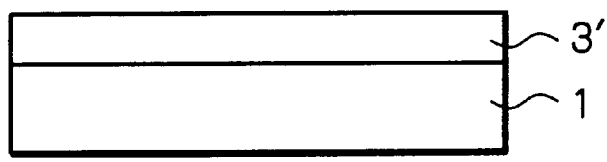

Next, referring to FIG. 6D, in the same way as in FIG. 2D, the contamination layer 4 is etched by a chemical dry etching process using CF$_4$ gas and/or Cl$_2$ gas, since the contamination layer 4 includes fluorine of high concentration. Thus, a source/drain region 3' having no contamination or defects is obtained.

Figure 6E:
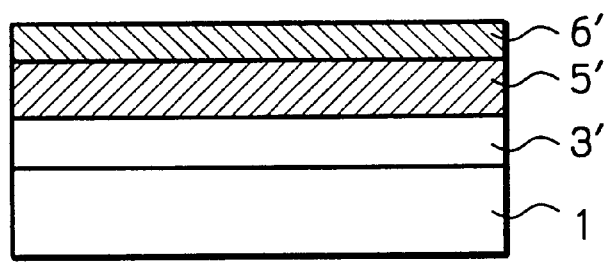

Next, referring to FIG. 6E, in the same way as in FIG. 2E, an about 40 nm thick silicon layer 5' having no defects is selectively grown on the source/drain region 3'. Note that the surface of the silicon layer 5' is even. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 6F.

Figure 6F:
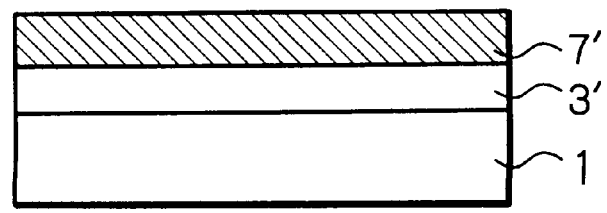

In FIG. 6F, an unreacted portion of the refractory metal layer 6' is removed.

Thus, in the fifth embodiment as illustrated in FIGS. 6A through 6F, since the interface between the refractory metal layer 7' and the source/drain region 3' is flat, the shallow junction of high concentration formed by the silicon substrate 1 and the source/drain region 3' is not deteriorated.

FIGS. 7A through 7F illustrate a sixth embodiment of the present invention.

Figure 7A:
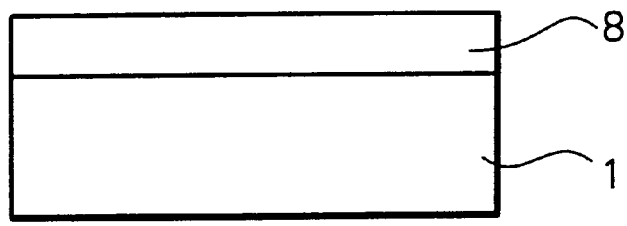
FIGS. 7A through 7F are cross-sectional views for explaining a sixth embodiment of the method for manufacturing a semiconductor device according to the present invention.

First, referring to FIG. 7A, in the same way as in FIG. 6A, an about 100 to 300 nm thick impurity diffusion source 8 made of silicon oxide having a boron concentration of higher than $7 \times 10^{19}$ atoms/cm$^2$ is deposited on a silicon substrate 1 which is of an N-type, for example.

Figure 7B:
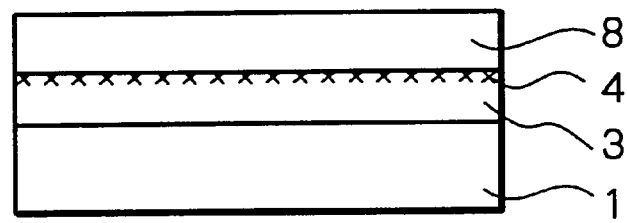

Next, referring to FIG. 7B, in the same way as in FIG. 6B, a heating operation is carried out at a temperature of higher than 600° C., for example, about 1000° C. for about 10 s to diffuse the impurity ions from the impurity diffusion source 8 into the silicon substrate 1. As a result, a source/drain region 3 is formed within the silicon substrate 1. This is called a solid phase diffusion process. Simultaneously, a contamination layer 4 is formed on the silicon substrate 1. The contamination layer 4 is made of contamination material such as oxygen and fluorine.

Figure 7C:
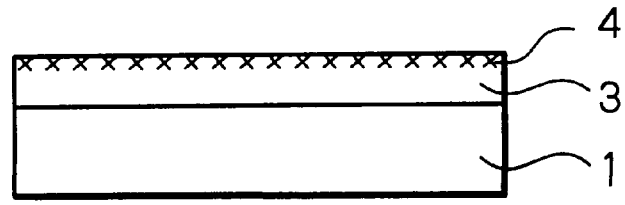

Next, referring to FIG. 7C, in the same way as in FIG. 6C, the impurity diffusion source 8 is removed by a dry etching process using chlorine gas or a wet etching process using fluoric acid.

Figure 7D:
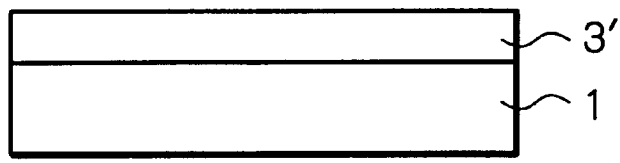

Next, referring to FIG. 7D, in the same way as in FIG. 5D, the contamination layer 4 is evaporated by a heating process at a temperature of about 1000° C. for about 10 s in a vacuum atmosphere or an inactive gas atmosphere such as an argon gas atmosphere, since the contamination layer 4 includes fluorine of high concentration. Thus, a source/drain region 3' having no contamination or defects is obtained.

Figure 7E:
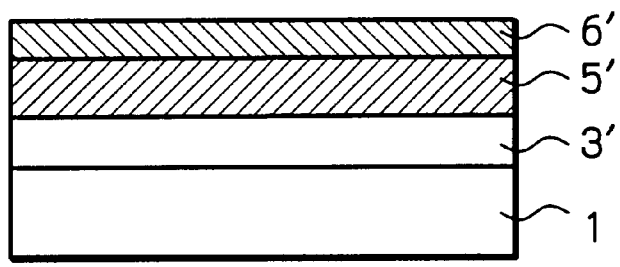

Next, referring to FIG. 7E, in the same way as in FIG. 6E, an about 40 nm thick silicon layer 5' having no defects is selectively grown on the source/drain region 3'. Note that the surface of the silicon layer 5' is even. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 7F.

Figure 7F:
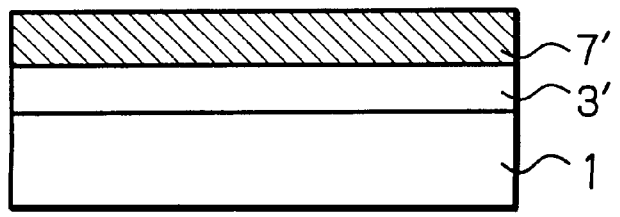

In FIG. 7F, an unreacted portion of the refractory metal layer 6' is removed.

Thus, in the sixth embodiment as illustrated in FIGS. 7A through 7F, since the interface between the refractory metal layer 7' and the source/drain region 3' is flat, the shallow junction of high concentration formed by the silicon substrate 1 and the source/drain region 3' is not deteriorated.

FIGS. 8A through 8E illustrate a seventh embodiment of the present invention.

Figure 8A:
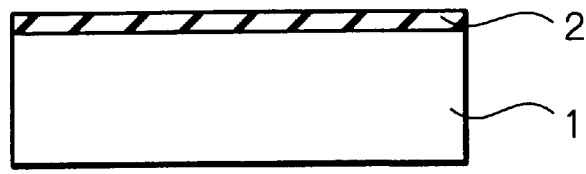
FIGS. 8A through 8E are cross-sectional views for explaining a seventh embodiment of the method for manufacturing a semiconductor device according to the present invention.

First, referring to FIG. 8A, in the same way as in FIG. 1A, an about 5 to 30 nm thick cover layer 2 made of silicon oxide or the like is deposited by a thermal oxidation process or a CVD process on a silicon substrate 1 which is of an N-type, for example. Then, about $1 \sim 5 \times 10^{15}$ impurity ions such as fluoroboron ions per cm2 are implanted at an energy of about 10 to 60 keV into the silicon substrate 1. Then, an annealing operation is carried out at a temperature of about 1000° C. for about 10 s to activate the implanted impurity ions in the silicon substrate 1.

Figure 8B:
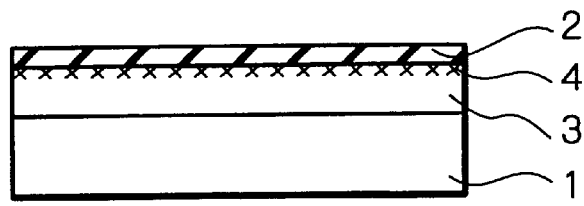

As a result, as illustrated in FIG. 8B, in the same way as in FIG. 1B, a source/drain region 3 is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron (BF$_2$) ions.

Figure 8C:
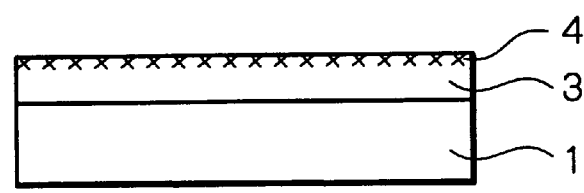

Next, referring to FIG. 8C, in the same way as in FIG. 1C, the cover layer 2 is removed by a dry etching process using chlorine gas or a wet etching process using fluoric acid.

Figure 8D:
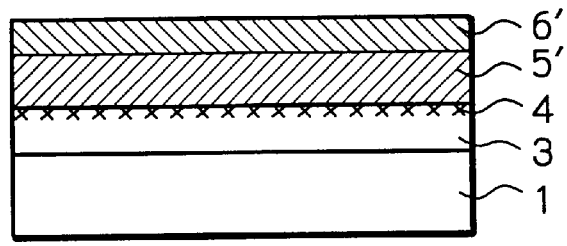

Next, referring to FIG. 8D, an about 40 nm thick silicon layer 5' is selectively grown on the source/drain region 3 having the contamination layer 4 in a reaction rate determining region where the flow rate of silane gas is about 5 to 1000 sccm and the growth temperature is about 400 to 650° C. The silicon layer 5' grown in the reaction rate determining region has no defects and is almost flat regardless of the crystal property of the underlying the source/drain region 3. In this case, since the growth ratio of silicon on silicon and on silicon oxide, an etching process using halogen gas such as chlorine gas or fluorine gas is intermittently carried out during the growth of the silicon layer 5' to remove the silicon only on the silicon oxide. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 8E.

Figure 8E:
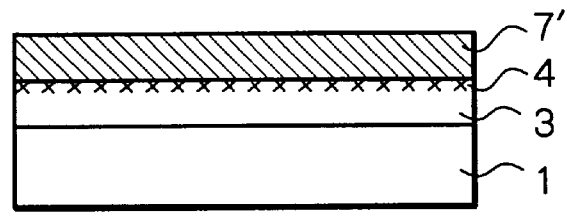

In FIG. 8E, an unreacted portion of the refractory metal layer 6' is removed.

Thus, in the seventh embodiment as illustrated in FIGS. 8A through 8E, since the interface between the refractory metal layer 7' and the source/drain region 3 is flat, the shallow junction of high concentration formed by the silicon substrate 1 and the source/drain region 3 is not deteriorated.

FIGS. 9A through 9F illustrate an eighth embodiment of the present invention.

Figure 9A:
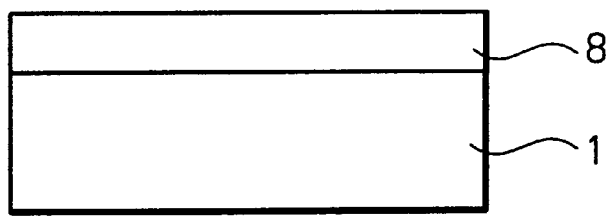
FIGS. 9A through 9E are cross-sectional views for explaining an eighth embodiment of the method for manufacturing a semiconductor device according to the present invention.

First, referring to FIG. 9A, in the same way as in FIG. 6A, an about 100 to 300 nm thick impurity diffusion source 8 made of silicon oxide having a boron concentration of higher than $7 \times 10^{19}$ atoms/cm$^2$ is deposited on a silicon substrate 1 which is of an N-type, for example.

Figure 9B:
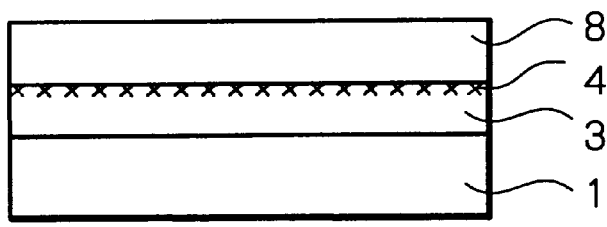

Next, referring to FIG. 9B, in the same way as in FIG. 6B, a heating operation is carried out at a temperature of higher than 600° C., for example, about 1000° C. for about 10 s to diffuse the impurity ions from the impurity diffusion source 8 into the silicon substrate 1. As a result, a source/drain region 3 is formed within the silicon substrate 1. This is called a solid phase diffusion process. Simultaneously, a contamination layer 4 is formed on the silicon substrate 1. The contamination layer 4 is made of contamination material such as oxygen, fluorine and the like.

Figure 9C:
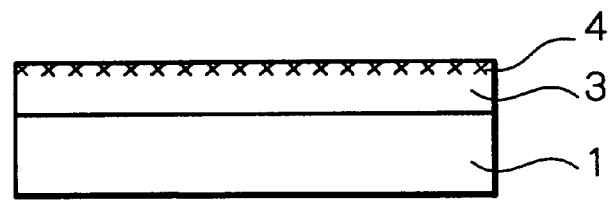
Figure 9D:
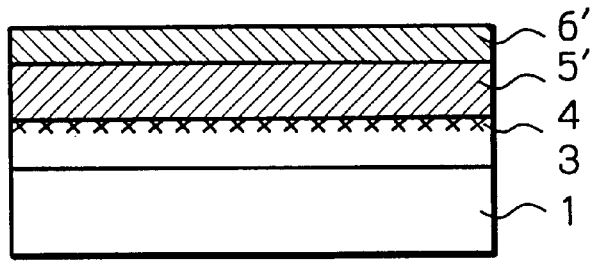

Next, referring to FIG. 9D, in the same way as in FIG. 8D, an about 40 nm thick silicon layer 5' is selectively grown on the source/drain region 3 having the contamination layer 4 in a reaction rate determining region where the flow rate of silane gas is about 5 to 1000 sccm and the growth temperature is about 400 to 650° C.

The silicon layer 5' grown in the reaction rate determining region has no defects and is almost flat regardless of the crystal property of the underlying the source/drain region 3. In this case, since the growth ratio of silicon on silicon and on silicon oxide, an etching process using halogen gas such as chlorine gas or fluorine gas is intermittently carried out during the growth of the silicon layer 5' to remove the silicon only on the silicon oxide. Then, a refractory metal layer 6' made of titanium is deposited on the entire surface. Then, a heating operation is carried out, so that the refractory metal layer 6' reacts with the silicon layer 5'. As a result, an even refractory metal silicide layer 7' is formed as illustrated in FIG. 9E.

Figure 9E:
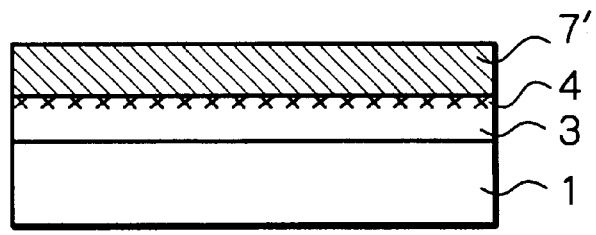

In FIG. 9E, an unreacted portion of the refractory metal layer 6' is removed.

Thus, in the eighth embodiment as illustrated in FIGS. 9A through 9E, since the interface between the refractory metal layer 7' and the source/drain region 3 is flat, the shallow junction of high concentration formed by the silicon substrate 1 and the source/drain region 3 is not deteriorated.

Figure 10A:
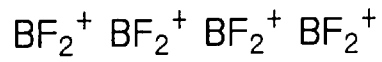
FIGS. 10A through 10E are cross-sectional views for explaining a ninth embodiment of the method for manufacturing a semiconductor device according to the present invention.
Figure 10A:
Figure 10A:
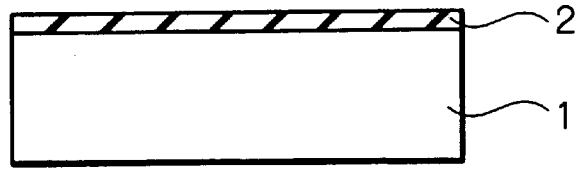
Figure 10B:
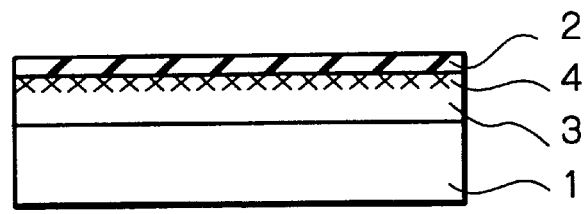
Figure 10C:
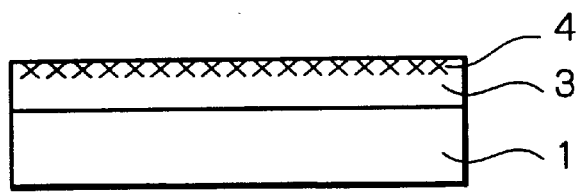
Figure 10D:
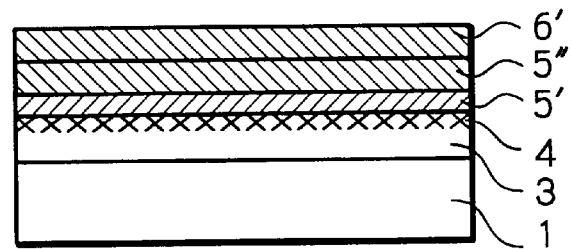

FIGS. 10A through 10E illustrate a ninth embodiment of the present invention. In the ninth embodiment, a process for selectively growing another silicon layer 5' on the silicon layer 5' as illustrated in FIG. 10D is added to the processes in the seventh embodiment. In this case, the silicon layer 5' is about 5 nm thick. This silicon layer 5' is obtained by three consecutive operations of supplying a 20 sccm flow rate of $Si_2H_6$ gas substrate for 10 s and thereafter supplying a 1 sccm flow rate of $Cl_2$ gas for 15 s at the growth temperature of 630° C. under the reaction rate determining condition. Thereafter, the silicon layer 5" is selectively grown in a supply rate determining region where the flow rate of silane gas is about 0.1 to 5 sccm and the growth temperature is about 650 to 1000° C. under the supply rate determining condition. The silicon layer 5" is about 35 nm thick. This silicon layer 5" is obtained by supplying a 1 sccm flow rate of $Si_2H_6$ gas at the growth temperature of about 660° C. for about 200 s. As a result, the surface of the silicon layer 5' becomes more flat than that of the silicon layer 5'.

Figure 10E:
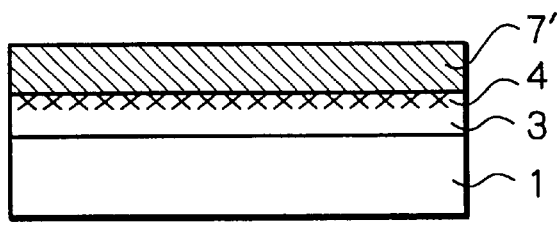

Note that the silicon layer 5' can be about 0.1 to 500 nm thick to completely cover the contamination layer 4 of the source/drain region 3. Also, the thickness of the silicon layer 5" can be determined in accordance with a required thickness of the refractory metal silicide layer 7' as illustrated in FIG. 10E.

Figure 11A:
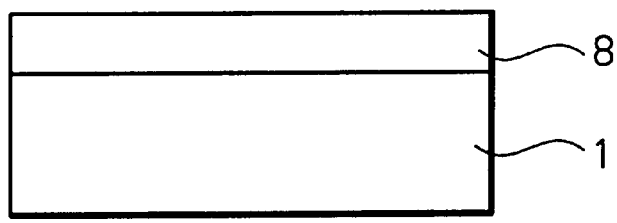
FIGS. 11A through 11E are cross-sectional views for explaining a tenth embodiment of the method for manufacturing a semiconductor device according to the present invention.
Figure 11B:
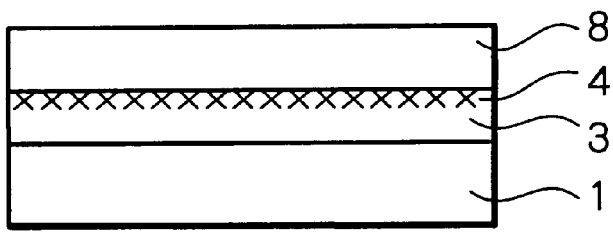
Figure 11C:
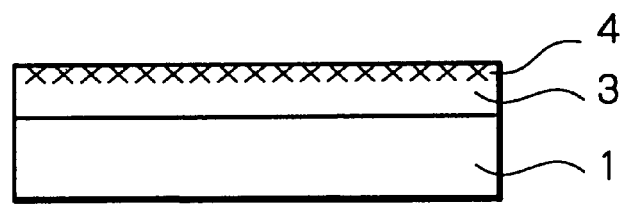
Figure 11D:
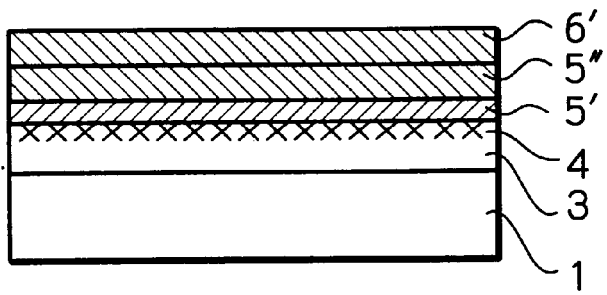

FIGS. 11A through 11E illustrate a tenth embodiment of the present invention. In the tenth embodiment, a process for selectively grow another silicon layer 5" on the silicon layer 5' as illustrated in FIG. 11D is added to the processes in the eighth embodiment. In this case, the silicon layer 5' is about 5 nm thick. This silicon layer 5' is obtained by three consecutive operations of supplying a 20 sccm flow rate of $Si_2H_6$ gas for 10 s and thereafter supplying a 1 sccm flow rate of $Cl_2$ gas for 15 s at the growth temperature of 630° C. under the reaction rate determining condition. Thereafter, the silicon layer 5" is selectively grown in a supply rate determining region where the flow rate of silane gas is about 0.1 to 5 sccm and the growth temperature is about 650 to 1000° C. The silicon layer 5" is about 35 nm thick. This silicon layer 5" is obtained by supplying a 1 sccm flow rate of $Si_2H_6$ gas at the growth temperature of about 660° C. for about 200 s. As a result, the surface of the silicon layer 5" becomes more flat than that of the silicon layer 5'.

Figure 11E:
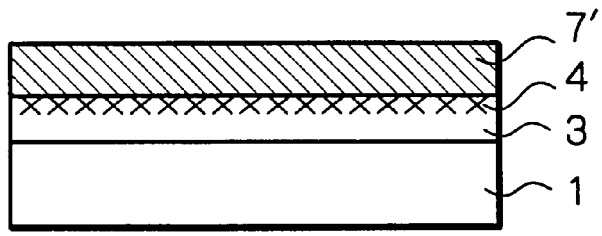

Also, in the tenth embodiment, note that the silicon layer 5' can be about 0.1 to 500 nm thick to completely cover the contamination layer 4 of the source/drain region 3. Also, the thickness of the silicon layer 5" can be determined in accordance with a required thickness of the refractory metal silicide layer 7' as illustrated in FIG. 11E.

In FIGS. 12A through 12F, which illustrate an eleventh embodiment of the present invention, the seventh embodiment is applied to a lightly-doped drain (LDD) structure.

Figure 12A:
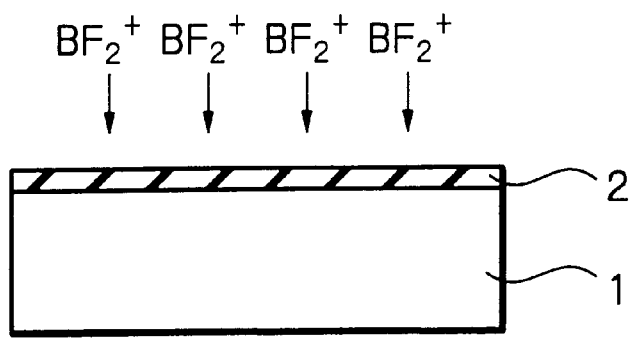
FIGS. 12A through 12F are cross-sectional views for explaining an eleventh embodiment of the method for manufacturing a semiconductor device according to the present invention.

First, referring to FIG. 12A, in the same way as in FIG. 8A, an about 5 to 30 nm thick cover layer 2 made of silicon oxide or the like is deposited by a thermal oxidation process or a CVD process on a silicon substrate 1 which is of an N-type, for example. Then, about $1 \sim 3 \times 10^{15}$ impurity ions such as fluoroboron ions per cm$^2$ are implanted at an energy of about 10 to 60 kev into the silicon substrate 1. Then, an annealing operation is carried out at a temperature of about 1000° C. for about 10 s to activate the implanted impurity ions in the silicon substrate 1. Note that the annealing operation can be deleted.

Figure 12B:
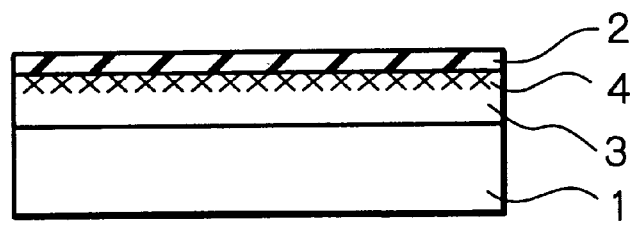

As a result, as illustrated in FIG. 12B, in the same way as in FIG. 8B, a source/drain region 3 which is in this case an LDD region is formed within the silicon substrate 1. Simultaneously, a contamination layer 4 is formed on the silicon substrate 1. The contamination layer 4 is made of contamination material such as oxygen implanted simultaneously with the implantation of impurity ions and fluorine of fluoroboron ($BF_2$) ions.

Figure 12C:
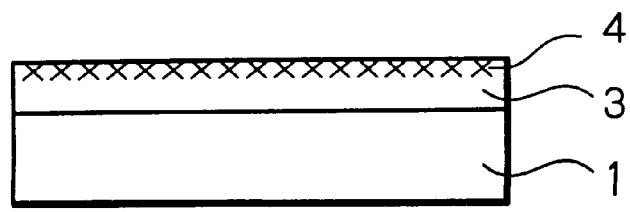

Next, referring to FIG. 12c, in the same way as in FIG. 8C, the cover layer 2 is removed by a dry etching process using chlorine gas or a wet etching process using fluoric acid.

Figure 12D:
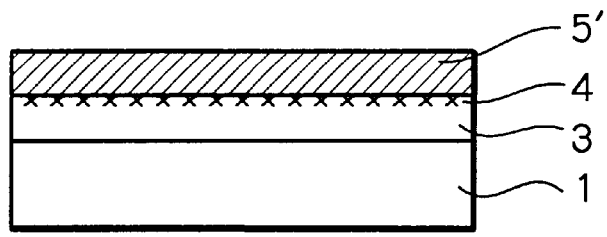

Next, referring to FIG. 12D, an about 40 nm thick silicon layer 5' is selectively grown on the source/drain region 3 having the contamination layer 4 in a reaction rate determining region where the flow rate of silane gas is about 5 to 1000 sccm and the growth temperature is about 400 to 650° C. The silicon layer 5' grown in the reaction rate determining region has no defects and is almost flat regardless of the crystal property of the underlying the source/drain region 3. In this case, since the growth ratio of silicon on silicon and on silicon oxide is small, an etching process using halogen gas such as chlorine gas or fluorine gas is intermittently carried out during the growth of the silicon layer 5' to remove the silicon only on the silicon oxide.

Figure 12E:
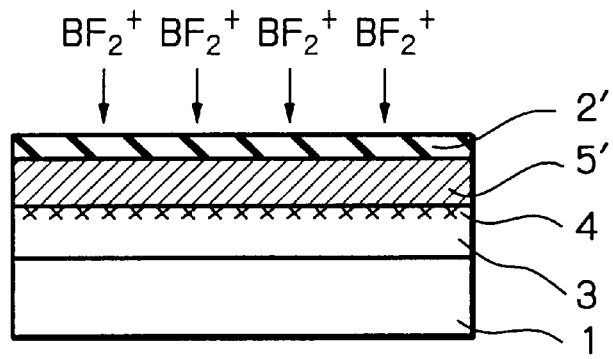

Next, referring to FIG. 12E, an about 5 to 30 nm thick cover layer 2' made of silicon oxide or the like is deposited by a thermal oxidation process or a CVD process on the silicon layer 5'. Then, about $1\sim3\times10^{16}$ impurity ions such as fluoroboron ions per $cm^2$ are implanted at an energy of about 10 to 60 keV into the silicon layer 5'. Then, an annealing operation is carried out at a temperature of about 1000° C. for about 10 s to activate the implanted impurity ions in the silicon layer 5'.

Note that an impurity diffusion source including a high concentration of impurities can be used instead of the ion implantation process as shown in FIG. 12E.

Figure 12F:
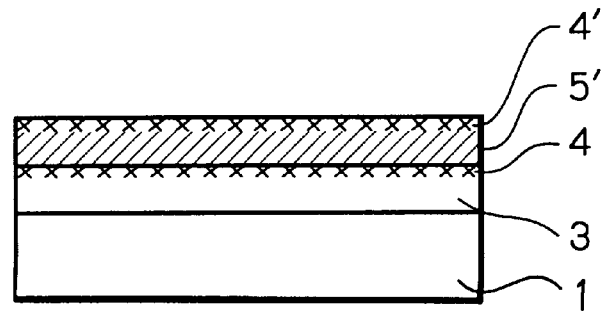

Next, referring to FIG. 12F, the cover layer 2' is removed by a dry etching process using chlorine gas or a wet etching process using fluoric acid.

As a result, as illustrated in FIG. 12F, the silicon layer 5' also become a source/drain region, thus obtaining an LDD structure. Simultaneously, a contamination layer 4' is formed on the silicon layer 5'. The contamination layer 4' is made of contamination material such as oxygen implanted simultaneously with the implantation of impurity ions and fluorine of fluoroboron ($BF_2$) ions. Then, if a refractory metal layer (not shown) made of titanium is deposited on the entire surface. Then, a heating operation is carried out, so that the refractory metal layer reacts with the silicon layer 5'. As a result, an even refractory metal silicide layer (not shown) is formed.

Thus, in the eleventh embodiment as illustrated in FIGS. 12A through 12F, since the interface between the refractory metal layer and the source/drain region (3, 5') is flat, the shallow junction of high concentration formed by the silicon substrate 1 and the source/drain region (3, 5') is not deteriorated.

In FIGS. 13A through 13F, which illustrate a twelfth embodiment of the present invention, the seventh embodiment is applied to an LDD structure.

Figure 13A:
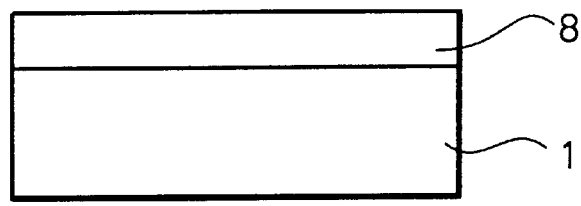
FIGS. 13A through 13F are cross-sectional views for explaining a twelfth embodiment of the method for manufacturing a semiconductor device according to the present invention.

First, referring to FIG. 13A, in the same way as in FIG. 9A, an about 100 to 300 nm thick impurity diffusion source 8 made of silicon oxide having a boron concentration of higher than $7\times10^{19}$ atoms/$cm^2$ is deposited on a silicon substrate 1 which is of an N-type, for example.

Figure 13B:
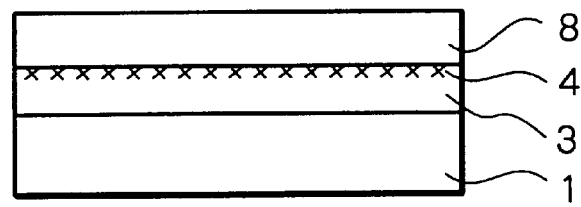

Next, referring to FIG. 13B, in the same way as in FIG. 9B, a heating operation is carried out at a temperature of higher than 600° C., for example, about 1000° C. for about 10 s to diffuse the impurity ions from the impurity diffusion source 8 into the silicon substrate 1.

Figure 13C:
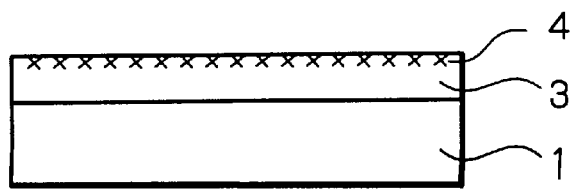

Next, referring to FIG. 13C, in the same way as in FIG. 9C, the impurity diffusion source 8 is removed by a dry etching process using chlorine gas or a wet etching process using fluoric acid.

Figure 13D:
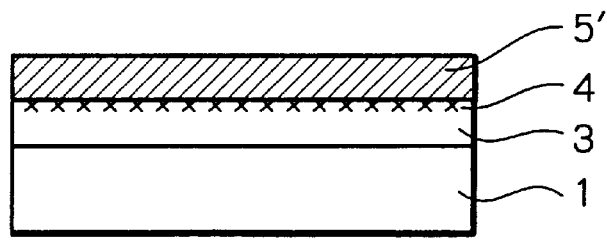

Next, referring to FIG. 13D, in the same way as in FIG. 12D, an about 40 nm thick silicon layer 5' is selectively grown on the source/drain region 3 having the contamination layer 4 in a reaction rate determining region where the flow rate of silane gas is about 5 to 1000 sccm and the growth temperature is about 400 to 650° C. The silicon layer 5' grown in the reaction rate determining region has no defects and is almost flat regardless of the crystal property of the underlying the source/drain region 3. In this case, since the growth ratio of silicon on silicon and on silicon oxide, an etching process using halogen gas such as chlorine gas or fluorine gas is intermittently carried out during the growth of the silicon layer 5' to remove the silicon only on the silicon oxide.

Figure 13E:
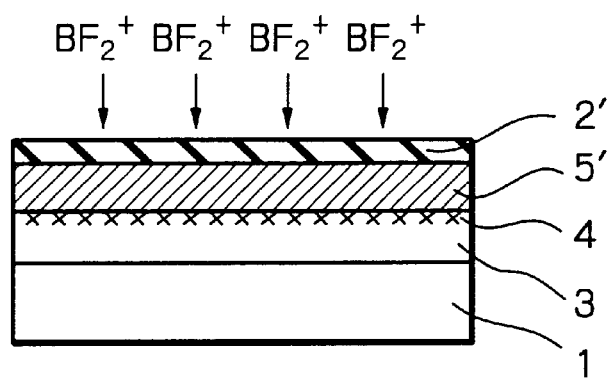

Next, referring to FIG. 13E, in the same way as in FIG. 12E, an about 5 to 30 nm thick cover layer 2' made of silicon oxide or the like is deposited by a thermal oxidation process or a CVD process on the silicon layer 5'. Then, about $1\sim3\times10^{16}$ impurity ions such as fluoroboron ions per cm2 are implanted at an energy of about 10 to 60 keV into the silicon layer 5'. Then, an annealing operation is carried out at a temperature of about 1000° C. for about 10 s to activate the implanted impurity ions in the silicon layer 5'.

Note that an impurity diffusion source including a high concentration of impurities can be used instead of the ion implantation process as shown in FIG. 13E.

Figure 13F:
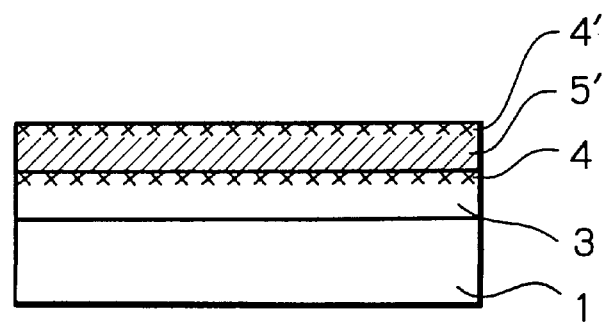
Figure 14A:
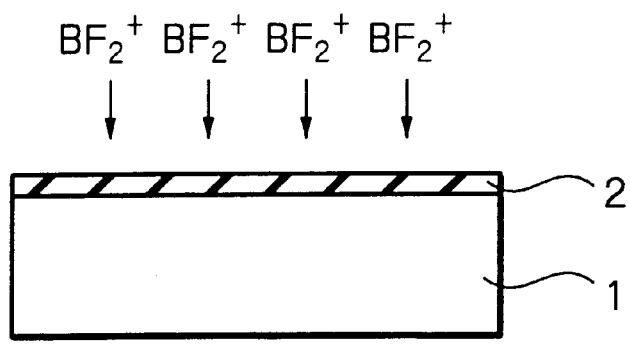
FIGS. 14A through 14F are cross-sectional views for explaining a thirteenth embodiment of the method for manufacturing a semiconductor device according to the present invention.
Figure 14B:
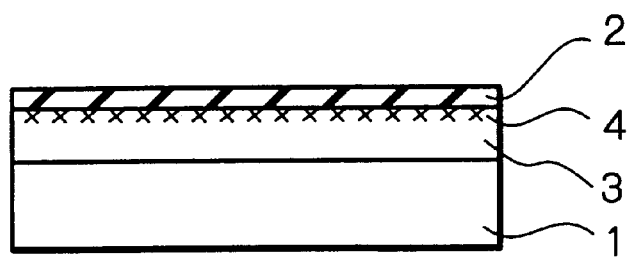
Figure 14C:
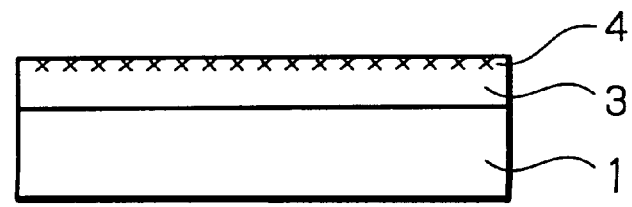
Figure 14D:
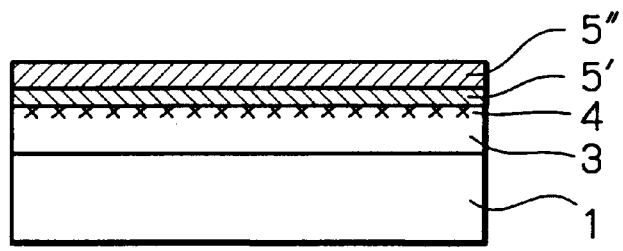
Figure 14E:
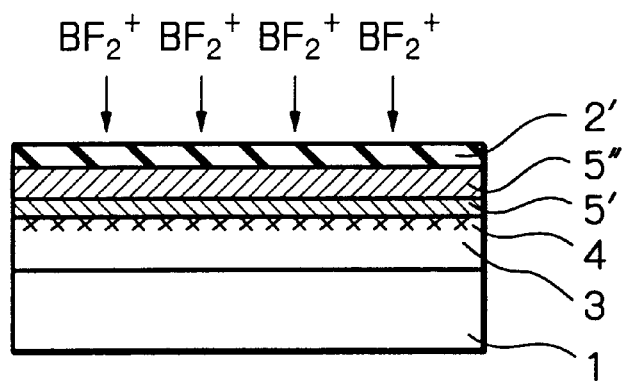
Figure 14F:
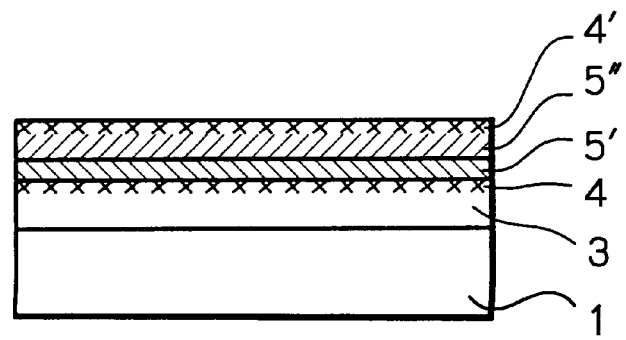
Figure 15A:
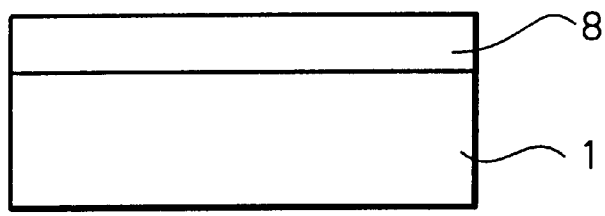
FIGS. 15A through 15F are cross-sectional views for explaining a fourteenth embodiment of the method for manufacturing a semiconductor device according to the present invention.
Figure 15B:
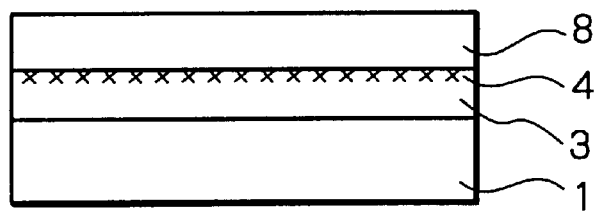
Figure 15C:
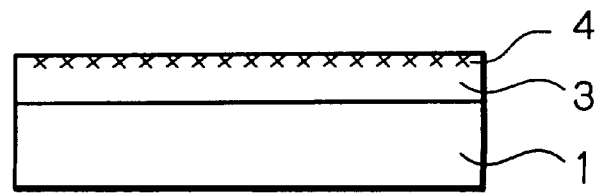
Figure 15D:
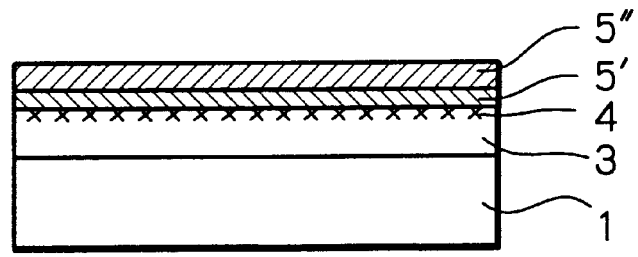
Figure 15E:
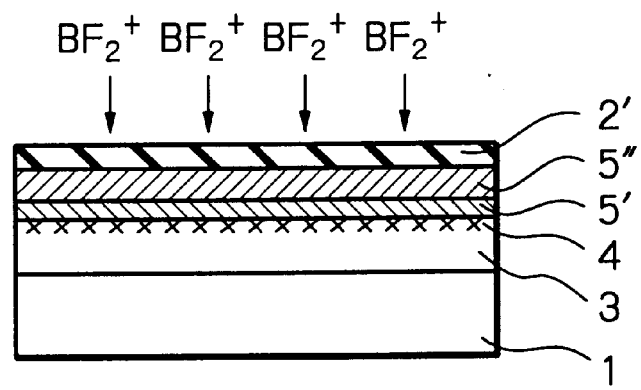
Figure 15F:
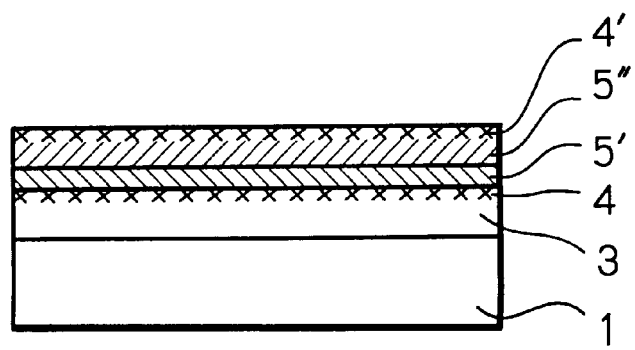

Next, referring to FIG. 13F, in the same way as in FIG. 12F, the cover layer 2' is removed by a dry etching process using chlorine gas or a wet etching process using fluoric acid.

As a result, as illustrated in FIG. 13F, the silicon layer 5' also become a source/drain region, thus obtaining an LDD structure. Simultaneously, a contamination layer 4' is formed on the silicon layer 5'. The contamination layer 4' is made of contamination material such as oxygen implanted simultaneously with the implantation of impurity ions and fluorine of fluoroboron ($BF_2$) ions. Then, if a refractory metal layer (not shown) made of titanium is deposited on the entire surface. Then, a heating operation is carried out, so that the refractory metal layer reacts with the silicon layer 5'. As a result, an even refractory metal silicide layer (not shown) is formed.

Thus, in the twelfth embodiment as illustrated in FIGS. 13A through 13F, since the interface between the refractory metal layer and the source/drain region (3, 5') is flat, the shallow junction of high concentration formed by the silicon substrate 1 and the source/drain region (3, 5') is not deteriorated.

FIGS. 14A through 14E illustrate a thirteenth embodiment of the present invention. In the thirteenth embodiment, a process for selectively grow another silicon layer 5" on the silicon layer 5' as illustrated in FIG. 12D is added to the processes in the eleventh embodiment. In this case, the silicon layer 5' is about 5 nm thick. This silicon layer 5' is obtained by three consecutive operations of supplying a 20 sccm flow rate of $Si_2H_6$ gas substrate for 10 s and thereafter supplying a 1 sccm flow rate of $Cl_2$ gas for 15 s at the growth temperature of 630° C. Thereafter, the silicon layer 5" is selectively grown in a supply rate determining region where the flow rate of silane gas is about 0.1 to 5 sccm and the growth temperature is about 650 to 1000° C. The silicon layer 5' is about 35 nm thick. This silicon layer 5" is obtained by supplying a 1 sccm flow rate of $Si_2H_6$ gas at the growth temperature of about 660° C. for 200 s. As a result, the surface of the silicon layer 5" becomes more flat than that of the silicon layer 5'.

Note that the silicon layer 5' can be about 0.1 to 500 nm thick to completely cover the contamination layer 4 of the source/drain region 3. Also, the thickness of the silicon layer 5" can be determined in accordance with a required thickness of the refractory metal silicide layer 7' as illustrated in FIG. 10E.

FIGS. 15A through 15E illustrate a fourteenth embodiment of the present invention. In the fourteenth embodiment, a process for selectively growing another. silicon layer 5" on the silicon layer 5' as illustrated in FIG. 13D is added to the processes in the twelfth embodiment. In this case, the silicon layer 5' is about 5 nm thick. This silicon layer 5' is obtained by three consecutive operations of supplying a 20 sccm flow rate of $Si_2H_6$ gas substrate for 10 s and thereafter supplying a 1 sccm flow rate of $Cl_2$ gas for 15 s at the growth temperature of 630° C. Thereafter, the silicon layer 5" is selectively grown in a supply rate determining region where the flow rate of silane gas is about 0.1 to 5 sccm and the growth temperature is about 650 to 1000° C. The silicon layer 5" is about 35 nm thick. This silicon layer 5" is obtained by supplying a 1 sccm flow rate of $Si_2H_5$ gas at the growth temperature of about 660° C. for 200 s. As a result, the surface of the silicon layer 5" becomes more flat than that of the silicon layer 5'.

In the above-described ninth, tenth, thirteenth and fourteenth embodiments, the flow rate of silane gas and the growth temperature of the silicon layer 5" are both different from the flow rate of silane gas and the growth temperature of the silicon layer 5', respectively. However, only one of the flow rate of silane gas and the growth temperature can be changed. In a first node, the same growth temperature such as about 550 to 750° C., preferably, about 630 to 660° C. is adopted for the growth of the silicon layers 5' and 5". In addition, a flow rate of about 5 to 1000 sccm flow rate of silane gas is adopted for the growth of the silicon layer 5' and a flow rate of about 0.1 to 2 sccm flow rate of silane gas is adopted for the growth of the silicon layer 5". On the other hand, in a second mode, the same flow rate of silane gas such as about 0.1 to 100 scam, preferably, about 1 to 20 sccm is adopted for the growth of the silicon layers 5' and 5". In addition, a growth temperature of about 400 to 650° C. is adopted for the growth of the silicon layer 5', and a growth temperature of about 650 to 1000° C. is adopted for the growth of the silicon layer 5'. Thus, the manufacturing steps are simplified, thus reducing the manufacturing cost.

In the above-mentioned embodiments, the growth of silicon is carried out by using an ultra high vacuum (UHv)-CVD apparatus mounting thereon a turbo molecular pump having a power of 1000 λ/s. Also, the silicon substrate 1 can be of a P-type; in this case, ions of the ion implantation are phosphorus ions or arsenic ions, and the impurity diffusion source 8 has a high concentration of phosphorus or arsenic. Further, the refractory metal layer can be made of cobalt, molybdenum or platinum.

As explained hereinabove, according to the present invention, the surface of a selectively-grown silicon layer is flat, and accordingly, an even refractory metal silicide layer can be formed on the selectively-grown silicon layer. Thus, a shallow junction of high concentration formed by an impurity diffusion (source/drain) region beneath the selectively-grown silicon layer and a silicon substrate is not deteriorated.

What is claimed is:

1. A method for manufacturing a semiconductor device, comprising the steps of:

forming a cover layer on a semiconductor substrate;

implanting impurity ions through said cover layer into said semiconductor substrate;

annealling said semiconductor substrate, so that an impurity diffusion region is formed within said semiconductor substrate;

removing said cover layer after said impurity diffusion region is formed;

carrying out a chemical dry etching process to remove a contamination layer from said impurity diffusion region, after said impurity diffusion region is formed; and selectively growing a silicon layer on said impurity diffusion region after said contamination layer is removed.

2. The method as set forth in claim 1, further comprising the steps of:

forming a refractory metal layer on said silicon layer; and heating said refractory metal layer and said silicon layer to form a refractory metal silicide layer.

3. A method for manufacturing a semiconductor device, comprising the steps of:

forming a cover layer on a semiconductor substrate;

implanting impurity ions through said cover layer into said semiconductor substrate;

annealling said semiconductor substrate, so that an impurity diffusion region is formed within said semiconductor substrate;

removing said cover layer after said impurity diffusion region is formed;

carrying out a beating process to remove a contamination layer from said impurity diffusion region, after said impurity diffusion region is formed; and selectively growing a silicon layer on said impurity diffusion region after said contamination layer is removed.

4. The method as set forth in claim 3, further comprising the steps of:

forming a refractory metal layer on said silicon layer; and heating said refractory metal layer and said silicon layer to form a refractory metal silicide layer.

5. A method for manufacturing a semiconductor device, comprising the steps of:

implanting impurity ions into a semiconductor substrate;

forming a cover layer on a semiconductor substrate after said impurity diffusion ions are implanted;

annealling said semiconductor substrate after said cover layer is formed, so that an impurity diffusion region is formed within said semiconductor substrate;

removing said cover layer after said impurity diffusion region is formed;

carrying out a chemical dry etching process to remove a contamination layer from said impurity diffusion region, after said impurity diffusion region is formed; and selectively growing a silicon layer on said impurity diffusion region after said contamination layer is removed.

6. The method as set forth in claim 5, further comprising the steps of:

forming a refractory metal layer on said silicon layer; and heating said refractory metal layer and said silicon layer to form a refractory metal silicide layer.

7. A method for manufacturing a semiconductor device, comprising the steps of:

implanting impurity ions into a semiconductor substrate;

forming a cover layer on said semiconductor substrate after said impurity ions are implanted;

annealling said semiconductor substrate after said cover layer is formed, so that an impurity diffusion region is formed within said semiconductor substrate;

removing said cover layer after said impurity diffusion region is formed;

carrying out a heating process to remove a contamination layer from said impurity diffusion region, after said impurity diffusion region is formed; and selectively growing a silicon layer on said impurity diffusion region after said contamination layer is removed.

8. The method as set forth in claim 7, further comprising the steps of:

forming a refractory metal layer on said silicon layer; and heating said refractory metal layer and said silicon layer to form a refractory metal silicide layer.

9. A method for manufacturing a semiconductor device, comprising the steps of:

forming an impurity diffusion source on a semiconductor substrate;

heating said impurity diffusion source to diffuse impurity ions from said impurity diffusion source into said semiconductor substrate, so that an impurity diffusion region is formed within said semiconductor substrate;

removing said impurity diffusion source after said impurity diffusion region is formed;

carrying out a chemical dry etching process to remove a contamination layer from said impurity diffusion region, after said impurity diffusion region is formed; and selectively growing a silicon layer on said impurity diffusion region after said contamination layer is removed.

10. The method as set forth in claim 9, further comprising the steps of:

forming a refractory metal layer on said silicon layer; and heating said refractory metal layer and said silicon layer to form a refractory metal silicide layer.

11. A method for manufacturing a semiconductor device, comprising the steps of:

forming an impurity diffusion source on a semiconductor substrate;

heating said impurity diffusion source to diffuse impurity ions from said impurity diffusion source into said semiconductor substrate, so that an impurity diffusion region is formed within said semiconductor substrate;

removing said impurity diffusion source after said impurity diffusion region is formed;

carrying out a heating process to remove a contamination layer from said impurity diffusion region, after said impurity diffusion region is formed; and selectively growing a silicon layer on said impurity diffusion region after said contamination layer is removed.

12. The method as set forth in claim 11, further comprising the steps of:

forming a refractory metal layer on said silicon layer; and heating said refractory metal layer and said silicon layer to form a refractory metal silicide layer.

13. A method for manufacturing a semiconductor device, comprising the steps of:

forming a first cover layer on a semiconductor substrate;

implanting impurity ions through said first cover layer into said semiconductor substrate;

annealling said semiconductor substrate, so that an impurity diffusion region is formed within said semiconductor substrate;

removing said first cover layer after said impurity diffusion region is formed;

selectively growing a first silicon layer on said impurity diffusion region by controlling a flow rate of silane gas and a growth temperature of said first silicon layer in a reaction rate determining region after said first cover layer is removed.

14. The method as set forth in claim 13, wherein the flow rate of silane gas in said reaction rate determining region is about 5 to 1000 sccm, and the growth temperature of said first silicon layer in said reaction rate determining region is about 400 to 650° C.

15. The method as set forth in claim 13, further comprising a step of etching silicon on silicon oxide using halogen gas during said selectively growing step.

16. The method as set forth in claim 13, further comprising a step of selectively growing a second silicon layer on said first silicon layer by controlling a flow rate of silane gas and a growth temperature of said second silicon layer in a supply rate determining region.

17. The method as set forth in claim 16, wherein the flow rate of silane gas in said supply rate determining region is about 0.1 to 5 sccm, and the growth temperature of said second silicon layer in said reaction rate determining region is about 650 to 1000° C.

18. The method as set forth in claim 16, wherein the growth temperature of said first silicon layer is the same as that of said second silicon layer.

19. The method as set forth in claim 18, wherein the growth temperature of said first and second silicon layers is about 550 to 750° C., the flow rate of silane gas in said reaction rate determining region being about 5 to 1000 sccm, the flow rate of silane gas in said supply rate determining region being about 0.1 to 2 sccm.

20. The method as set forth in claim 16, wherein the flow rate of silane gas in said reaction rate determining region is the same as that in said supply rate determining region.

21. The method as set forth in claim 20, wherein the flow rate of silane gas in said reaction rate determining region and in said supply rate determining region is about 0.1 to 100 sccm, the growth temperature of said first silicon layer being about 400 to 650° C., the growth temperature of said second silicon layer being about 650 to 1000° C.

22. The method as set forth in claim 16, further comprising the steps of:

forming a refractory metal layer on said second silicon layer; and heating said refractory metal layer and said silicon layers to form a refractory metal silicide layer.

23. The method as set forth in claim 16, further comprising the steps of:

forming a second cover layer on said second silicon layer;

implanting impurity ions through said second cover layer into said first and second silicon layers; and removing said second cover layer after said impurity ions are implanted into said first and second silicon layers, said impurity diffusion region and said first and second silicon layers forming a lightly-doped drain structure.

24. The method as set forth in claim 13, further comprising the steps of:

forming a refractory metal layer on said first silicon layer; and heating said refractory metal layer and said first silicon layer to form a refractory metal silicide layer.

25. The method as set forth in claim 13, further comprising the steps of:

forming a second cover layer on said first silicon layer;

implanting impurity ions through said second cover layer into said first silicon layer; and removing said second cover layer after said impurity ions are implanted into said first silicon layer, said impurity diffusion region and said first silicon layer forming a lightly-doped drain structure.

26. A method for manufacturing a semiconductor device, comprising the steps of:

forming an impurity diffusion source on a semiconductor substrate;

heating said impurity diffusion source to diffuse impurity ions from said impurity diffusion source into said semiconductor substrate, so that an impurity diffusion region is formed within said semiconductor substrate;

removing said impurity diffusion source after said impurity diffusion region is formed;

selectively growing a first silicon layer on said impurity diffusion region by controlling a flow rate of silane gas and a growth temperature of said first silicon layer in a reaction rate determining region.

27. The method as set forth in claim 26, wherein the flow rate of silane gas in said reaction rate determining region is about 5 to 1000 sccm, and the growth temperature of said first silicon layer in said reaction rate determining region is about 400 to 650° C.

28. The method as set forth in claim 26, further comprising a step of etching silicon on silicon oxide using halogen gas during said selectively growing step.

29. The method as set forth in claim 26, further comprising a step of selectively growing a second silicon layer on said first silicon layer by controlling a flow rate of silane gas and a growth temperature of said second silicon layer in a supply rate determining region.

30. The method as set forth in claim 29, wherein the flow rate of silane gas in said supply rate determining region is about 0.1 to 5 sccm, and the growth temperature of said second silicon layer in said reaction rate determining region is about 650 to 1000° C.

31. The method as set forth in claim 29, wherein the growth temperature of said first silicon layer is the same as that of said second silicon layer.

32. The method as set forth in claim 31, wherein the growth temperature of said first and second silicon layers is about 550 to 750° C., the flow rate of silane gas in said reaction rate determining region being about 5 to 1000 sccm, the flow rate of silane gas in said supply rate determining region being about 0.1 to 2 sccm.

33. The method as set forth in claim 29, wherein the flow rate of silane gas in said reaction rate determining region is the same as that in said supply rate determining region.

34. The method as set forth in claim 33, wherein the flow rate of silane gas in said reaction rate determining region and in said supply rate determining region is about 0.1 to 100 sccm, the growth temperature of said first silicon layer being about 400 to 650° C., the growth temperature of said second silicon layer being about 650 to 1000° C.

35. The method as set forth in claim 29, further comprising the steps of:

forming a refractory metal layer on said second silicon layer; and heating said refractory metal layer and said silicon layer to form a refractory metal silicide layer.

36. The method as set forth in claim 29, further comprising the steps of:

forming a first cover layer on said second silicon layer;

implanting impurity ions through said first cover layer into said first and second silicon layers; and removing said first cover layer after said impurity ions are implanted into said first and second silicon layers, said impurity diffusion region and said first and second silicon layers forming a lightly-doped drain structure.

37. The method as set forth in claim 26, further comprising the steps of:

forming a refractory metal layer on said first silicon layer; and heating said refractory metal layer and said first silicon layer to form a refractory metal silicide layer.

38. The method as set forth in claim 26, further comprising the steps of:

forming a first cover layer on said first silicon layer;

implanting impurity ions through said first cover layer into said first silicon layer; and removing said first cover layer after said impurity ions are implanted into said first silicon layer, said impurity diffusion region and said first silicon layer forming a lightly-doped drain structure.

39. A method for manufacturing a semiconductor device, comprising the steps of:

selectively growing a first silicon layer on a impurity diffusion region of a semiconductor substrate by controlling a flow rate of silane gas and a growth temperature of said first silicon layer in a reaction rate determining region.

40. The method as set forth in claim 39, wherein the flow rate of silane gas in said reaction rate determining region is about 5 to 1000 sccm, and the growth temperature of said first silicon layer in said reaction rate determining region is about 400 to 650° C.

41. The method as set forth in claim 39, further comprising a step of etching silicon on silicon oxide using halogen gas during said selectively growing step.

42. The method as set forth in claim 39, further comprising a step of selectively growing a second silicon layer on said first silicon layer by controlling a flow rate of silane gas and a growth temperature of said second silicon layer in a supply rate determining region.

43. The method as set forth in claim 42, wherein the flow rate of silane gas in said supply rate determining region is about 0.1 to 5 sccm, and the growth temperature of said second silicon layer in said reaction rate determining region is about 650 to 1000° C.

44. The method as set forth in claim 42, wherein the growth temperature of said first silicon layer is the same as that of said second silicon layer.

45. The method as set forth in claim 44, wherein the growth temperature of said first and second silicon layers is about 550 to 750° C., the flow rate of silane gas in said reaction rate determining region being about 5 to 1000 sccm, the flow rate of silane gas in said supply rate determining region being about 0.1 to 2 sccm.

46. The method as set forth in claim 42, wherein the flow rate of silane gas in said reaction rate determining region is the same as that in said supply rate determining region.

47. The method as set forth in claim 46, wherein the flow rate of silane gas in said reaction rate determining region and in said supply rate determining region is about 0.1 to 100 sccm, the growth temperature of said first silicon layer being about 400 to 650° C., the growth temperature of said second silicon layer being about 650 to 1000° C.

48. The method as set forth in claim 42, further comprising the steps of:

forming a refractory metal layer on said second silicon layer; and heating said refractory metal layer and said silicon layers to form a refractory metal silicide layer.

49. The method as set forth in claim 42, further comprising the steps of:

forming a cover layer on said second silicon layer;

implanting impurity ions through said cover layer into said first and second silicon layers; and removing said cover layer after said impurity ions are implanted into said first and second silicon layers, said impurity diffusion region and said first and second silicon layers forming a lightly-doped drain structure.

50. The method as set forth in claim 39, further comprising the steps of:

forming a refractory metal layer on said first silicon layer; and heating said refractory metal layer and said first silicon layer to form a refractory metal silicide layer.

51. The method as set forth in claim 39, further comprising the steps of:

forming a cover layer on said first silicon layer;

implanting impurity ions through said cover layer into said first silicon layer; and removing said cover layer after said impurity ions are implanted into said first silicon layer, said impurity diffusion region and said first silicon layer forming a lightly-doped drain structure.

* * * * *